United States Patent
Dodge et al.

(10) Patent No.: US 9,243,322 B2
(45) Date of Patent: Jan. 26, 2016

(54) METHODS FOR APPLYING A COATING TO A SUBSTRATE IN ROLLED FORM

(71) Applicant: 3M INNOVATIVE PROPERTIES COMPANY, St. Paul, MN (US)

(72) Inventors: Bill H. Dodge, Finlayson, MN (US); David K. Cinader, Jr., Walnut, CA (US); MaThazin Aung, Duarte, CA (US); Artin Margharian, Pasadena, CA (US)

(73) Assignee: 3M INNOVATIVE PROPERTIES COMPANY, Saint Paul, MN (US)

( * ) Notice: Subject to any disclaimer, the term of this patent is extended or adjusted under 35 U.S.C. 154(b) by 0 days.

(21) Appl. No.: 14/353,965

(22) PCT Filed: Oct. 26, 2012

(86) PCT No.: PCT/US2012/062117
§ 371 (c)(1),
(2) Date: Apr. 24, 2014

(87) PCT Pub. No.: WO2013/066749
PCT Pub. Date: May 10, 2013

(65) Prior Publication Data
US 2014/0272432 A1    Sep. 18, 2014

Related U.S. Application Data

(60) Provisional application No. 61/553,564, filed on Oct. 31, 2011.

(51) Int. Cl.
*C23C 16/04* (2006.01)
*C23C 16/455* (2006.01)
(Continued)

(52) U.S. Cl.
CPC ............... *C23C 16/04* (2013.01); *C23C 16/403* (2013.01); *C23C 16/45525* (2013.01);
(Continued)

(58) Field of Classification Search
None
See application file for complete search history.

(56) References Cited

U.S. PATENT DOCUMENTS 4,481,273 A * 11/1984 Katagiri et al. ............... 430/58.4
5,687,523 A * 11/1997 Stough ............................ 52/417
(Continued)

FOREIGN PATENT DOCUMENTS

JP     10-165861     6/1998
KR     2007-035864   4/2007
(Continued)

OTHER PUBLICATIONS

Davies, C. N., "The Separation of Airborne Dust and Particles," Institution of Mechanical Engineers, London Proceedings 1B, (1952) pp. 185-213.
(Continued)

*Primary Examiner* — Joseph Miller, Jr.
(74) *Attorney, Agent, or Firm* — James A. Baker

(57) ABSTRACT

Methods for applying a coating to a substrate in rolled form, the substrate including a first edge face and a second edge face opposite the first edge face, the substrate further having a first major surface and a second major surface opposite the first major surface, the first and second major surfaces extending between the first edge face and the second edge face, the methods including applying a coating to at least one edge face and optionally at least a portion of one or both major surfaces of the substrate in rolled form. Articles in rolled form prepared according to the foregoing methods are also disclosed.

19 Claims, 2 Drawing Sheets

(51) Int. Cl.
*C23C 16/54* (2006.01)
*C23C 16/40* (2006.01)

(52) U.S. Cl.
CPC ........ *C23C 16/45555* (2013.01); *C23C 16/545* (2013.01); *C23C 16/402* (2013.01); *C23C 16/405* (2013.01); *C23C 16/407* (2013.01)

(56) References Cited

U.S. PATENT DOCUMENTS

| | | |
|---|---|---|
| 6,613,383 B1 | 9/2003 | George |
| 6,713,177 B2 | 3/2004 | George |
| 6,913,827 B2 | 7/2005 | George |
| 7,641,837 B2 | 1/2010 | Takiyama |
| 7,842,214 B2 | 11/2010 | Romdhane |
| 2002/0076491 A1 | 6/2002 | Delperier |
| 2004/0022952 A1* | 2/2004 | Wong ..................... 427/385.5 |
| 2005/0172897 A1 | 8/2005 | Jansen |
| 2005/0186342 A1 | 8/2005 | Sager |
| 2006/0096911 A1 | 5/2006 | Brey |
| 2007/0224348 A1 | 9/2007 | Dickey |
| 2007/0281089 A1 | 12/2007 | Heller |
| 2009/0053482 A1 | 2/2009 | Baker |
| 2009/0137043 A1 | 5/2009 | Parsons |
| 2010/0075131 A1 | 3/2010 | Etzel |
| 2010/0075560 A1 | 3/2010 | Seshadri |
| 2010/0080841 A1 | 4/2010 | Porbeni |
| 2010/0112345 A1 | 5/2010 | Sieber |
| 2010/0189900 A1 | 7/2010 | Dickey |
| 2011/0049285 A1 | 3/2011 | Kinard |
| 2012/0070794 A1 | 3/2012 | Craig |

FOREIGN PATENT DOCUMENTS

| | | |
|---|---|---|
| KR | 10-1065312 | 9/2011 |
| WO | WO 2009-045752 | 4/2009 |
| WO | WO 2011-037798 | 3/2011 |
| WO | WO 2011-037831 | 3/2011 |
| WO | WO 2012-129143 | 9/2012 |

OTHER PUBLICATIONS

George, "Surface Chemistry for Molecular Layer Deposition of Organic and Hybrid Organic—Inorganic Polymers", Accounts of Chemical Research, 2009, vol. 42, No. 4, pp. 498-508.
International Search Report for PCT International Application No. PCT/US2012/062117, mailed on Feb. 7, 2013, 4 pages.

* cited by examiner

METHODS FOR APPLYING A COATING TO A SUBSTRATE IN ROLLED FORM

CROSS REFERENCE TO RELATED APPLICATIONS

This application is a national stage filing under 35 U.S.C. 371 of PCT/US2012/062117, filed Oct. 26, 2012, which claims priority to U.S. Provisional Patent Application No. 61/553,564, filed Oct. 31, 2011, the disclosures of which are incorporated by reference in their entirety herein.

FIELD

The disclosure relates to methods for applying a coating to a substrate in rolled form, and more particularly, to the application of a coating to at least one edge face of a rolled substrate using atomic layer deposition.

BACKGROUND

Products provided in rolled form (e.g. a roll of adhesive tape) are commonly prepared by applying (e.g., by coating) a liquid composition to a major surface of an unrolled substrate (e.g. a web), at least partially curing or drying the composition on the substrate, and then winding the substrate bearing the cured or dried composition onto a cylindrical core or mandrel in order to produce a roll of the coated product. The roll may be subsequently slit into rolls of smaller width by cutting through the rolled substrate in a direction perpendicular to the major surface.

However, some coating processes are not directed at coating a liquid onto a substrate, but rather, apply a vapor phase material to the substrate. One such exemplary vapor phase coating process is Atomic Layer Deposition (ALD). Atomic Layer Deposition was originally developed for use in fabricating thin film electroluminescent (TFEL) flat-panel displays. Interest in ALD has increased significantly over the years, focusing mainly on silicon-based substrates (e.g. wafers) useful in fabricating microelectronics due to its ability to produce very thin, conformable films with control of the composition and thickness of these films at the atomic level.

ALD has also been used to coat filler particles present in a dental composite, as described in International Patent Publication No. WO2009/045752 (Kalgutkar, et al.). Recently, ALD has been used to coat discrete substrate sheets (U.S. Pat. No. 6,713,177 B2, George et al.), to coat fibrous substrates (U.S. Patent Publication No. 2009/0137043, Parsons et al.), and to coat substrate webs using a continuous roll-to-roll web-handling system (U.S. Patent Publication No. 2010/0189900, Dickey et al.).

SUMMARY

In one aspect, the present disclosure features methods, more particularly methods for treating a substrate, even more particularly methods for applying a coating to a substrate in rolled form, the substrate comprising a first edge face and a second edge face opposite said first edge face, wherein the substrate comprises a first major surface and a second major surface opposite said first major surface, the first and second major surfaces extending between the first edge face and the second edge face, and applying a coating to at least one edge face of the substrate in rolled form. In some exemplary embodiments, the method includes applying a coating to at least one edge face and at least a portion of one major surface of the substrate in rolled form.

In some exemplary embodiments, applying the coating is carried out using atomic layer deposition, molecular layer deposition, or a combination thereof. In certain exemplary embodiments, applying the coating comprises a stepwise atomic layer deposition of the coating, wherein the stepwise atomic layer deposition of the coating comprises iteratively transmitting two or more reactive gases through the substrate in rolled form to induce two or more self-limiting reactions on at least one edge face and at least a portion of one major surface of the substrate in rolled form.

In additional exemplary embodiments of any of the foregoing methods, the coating is applied to at least a portion of each of the first and second major surface. In some exemplary embodiments, the coating is applied to at least a portion of one of the first major surface or the second major surface. In certain such exemplary embodiments, the coating is applied to the entire first major surface and both edge faces. In other such exemplary embodiments, the coating is applied to the entire second major surface and both edge faces.

In certain exemplary embodiments of any of the foregoing methods, the substrate further comprises a plurality of perforations, each of the plurality of perforations having an inner perimeter wall extending between the first major surface and the second major surface. In some such exemplary embodiments, at least one of the plurality of perforations includes a chad attached to the inner perimeter wall of the at least one of the plurality of perforations. In certain such exemplary embodiments, each of the plurality of perforations includes a chad attached to the corresponding inner perimeter wall of the each of the plurality of perforations. In further exemplary embodiments of any of the foregoing such methods, each chad comprises an exposed edge perimeter, and further wherein the coating is applied to the exposed edge perimeter of at least one chad. In additional such exemplary embodiments, the coating is applied to the exposed edge perimeter of each chad.

In further exemplary embodiments of the foregoing methods, the coating is applied to at least a portion of the inner perimeter wall of at least one of the plurality of perforations. In some such exemplary embodiments, the coating is applied to the entire inner perimeter wall of at least one of the plurality of perforations. In further such exemplary embodiments, the coating is applied to the entire inner perimeter wall of each of the plurality of perforations.

In any of the foregoing methods, the substrate may comprise a flexible film, a fibrous web, or a combination thereof. In some exemplary embodiments, the substrate is microporous. In certain exemplary embodiments, the substrate further comprises a (co)polymer.

In any of the foregoing methods, the coating may comprise an inorganic material. Optionally, the inorganic material comprises at least one oxide of aluminum, silicon, titanium, tin, zinc, or a combination thereof.

In another aspect, an article in rolled form is prepared according to any of the foregoing methods.

Various aspects and advantages of exemplary embodiments of the present disclosure have been summarized. The above Summary is not intended to describe each illustrated embodiment or every implementation of the present disclosure. Further features and advantages are disclosed in the embodiments that follow. The drawings and the detailed description that follow more particularly exemplify certain preferred embodiments using the principles disclosed herein.

BRIEF DESCRIPTION OF THE DRAWINGS

The disclosure may be more completely understood in consideration of the following detailed description of various embodiments of the disclosure in connection with the accompanying figures, in which.

Figure 1:
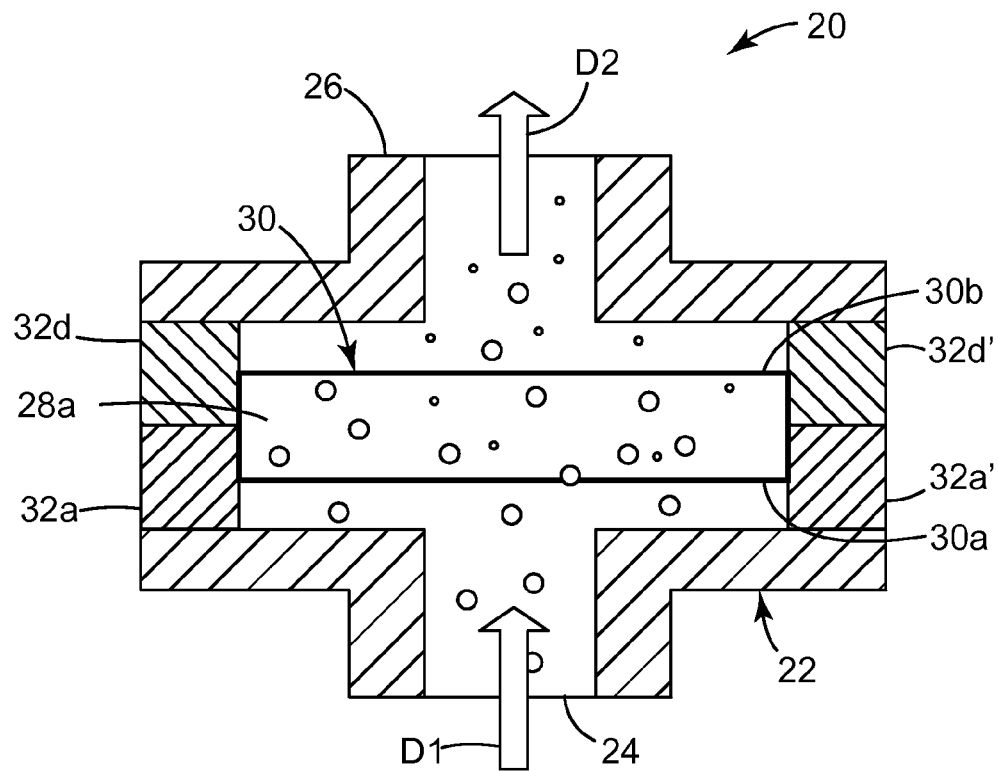
FIG. 1 is a cross-sectional side view illustrating an exemplary apparatus and method for applying a coating to a substrate in rolled form useful in some exemplary embodiments of the present disclosure.

While the above-identified drawings, which may not be drawn to scale, set forth various embodiments of the present disclosure, other embodiments are also contemplated, as noted in the Detailed Description. In all cases, this disclosure describes the presently disclosed disclosure by way of representation of exemplary embodiments and not by express limitations. It should be understood that numerous other modifications and embodiments can be devised by those skilled in the art, which fall within the scope and spirit of this disclosure.

DETAILED DESCRIPTION

As used in this Specification, the recitation of numerical ranges by endpoints includes all numbers subsumed within that range (e.g. 1 to 5 includes 1, 1.5, 2, 2.75, 3, 3.8, 4, and 5, and the like).

Unless otherwise indicated, all numbers expressing quantities or ingredients, measurement of properties and so forth used in the Specification and embodiments are to be understood as being modified in all instances by the term "about." Accordingly, unless indicated to the contrary, the numerical parameters set forth in the foregoing specification and attached listing of embodiments can vary depending upon the desired properties sought to be obtained by those skilled in the art utilizing the teachings of the present disclosure. At the very least, and not as an attempt to limit the application of the doctrine of equivalents to the scope of the claimed embodiments, each numerical parameter should at least be construed in light of the number of reported significant digits and by applying ordinary rounding techniques.

For the following defined terms, these definitions shall be applied for the entire Specification, including the claims, unless a different definition is provided in the claims or elsewhere in the Specification based upon a specific reference to a modification of a term used in the following Glossary:

GLOSSARY

The words "a", "an", and "the" are used interchangeably with "at least one" to mean one or more of the elements being described.

The term "layer" refers to any material or combination of materials on or overlaying a substrate.

Words of orientation such as "atop, "on," "covering," "uppermost," "overlaying," "underlying" and the like for describing the location of various layers, refer to the relative position of a layer with respect to a horizontally-disposed, upwardly-facing substrate. It is not intended that the substrate, layers or articles encompassing the substrate and layers, should have any particular orientation in space during or after manufacture.

The term "coating" refers to a relatively thin layer of material applied to and adhering to an underlying substrate.

The terms "overcoat" or "overcoated" to describe the position of a layer with respect to a substrate or another layer of a multi-layer construction, means that the described layer is atop or overlaying the substrate or another layer, but not necessarily adjacent to or contiguous with either the substrate or the other layer.

The term "(co)polymer" includes homopolymers and copolymers, as well as homopolymers or copolymers that may be formed in a miscible blend, e.g., by coextrusion or by reaction, including, e.g., transesterification. The term "copolymer" includes both random and block copolymers.

The term "nonporous" means that the substrate is substantially free of pores.

The term "porous" means that the substrate contains openings (i.e. "pores") sufficient that at least a gas can pass through the openings and the substrate.

The term "microporous" means that the substrate contains pores having a median internal cross-sectional dimension (a "median pore size," e.g. a diameter for the case of cylindrical pores) of no greater than 1,000 micrometers such that a gas may pass through the substrate within the pores. Preferred microporous substrates include pores having a median pore size of from 0.01 to 1,000 micrometers, inclusive, more preferably from 0.1 to 100 micrometers, inclusive, even more preferably from 0.2 to 20 micrometers, inclusive, and most preferably from 0.3 to 3 micrometers or even 1 micrometer, inclusive. As used throughout this specification, median pore size may be determined using the bubble point pressure measurement method described in ASTM Standard F316-03.

The term "non-ceramic" with reference to a substrate prior to deposition of the coating means that the substrate does not substantially include inorganic metal oxides, metal nitrides, metal carbides, or other ceramic materials. Preferred "non-ceramic" substrates are completely free of ceramic materials, and more preferably consist essentially of fibrous organic materials (e.g. polymeric fibers, natural fibers, carbon fibers, and the like), and even more preferably consist only of organic materials The term "compressible material" with reference to a substrate broadly refers to a material that is significantly reduced in volume upon application of pressures typically employed to place and/or position a dental article on a tooth structure. Forces typically employed to place and/or position a dental article on a tooth structure generally range from 0.5 to 5 pound-force, as applied to a bonding base of area 0.106 square centimeters (0.0164 square inches). This corresponds to calculated pressures ranging from 0.2 to 2.0 megapascals. The ratio of the compressed volume/initial volume (i.e., compressibility) will vary depending on the compressible material used. In some embodiments, the compressibility is typically at most 0.9, at most 0.7, or at most 0.5. In some embodiments, the compressibility is at least 0.001, at least 0.01, or at least 0.1.

The term "chad" refers to a substrate fragment created when one or more perforations (e.g. holes) is formed extending through a major surface of a substrate, for example, by punching. Completely-punched perforations or holes generally produce chads that are removed from the perforations, forming a collection of substrate chads (e.g. confetti). Incompletely-punched perforations or holes generally result in chads that remain attached to the substrate, for example, where one or more portions of the exposed edge perimeter of the chad remains attached to the inner perimeter wall of the hole or perforation through the major surface of the substrate.

Various exemplary embodiments of the disclosure will now be described with particular reference to the Drawings. Exemplary embodiments of the disclosure may take on various modifications and alterations without departing from the spirit and scope of the disclosure. Accordingly, it is to be understood that the embodiments of the disclosure are not to be limited to the following described exemplary embodiments, but are to be controlled by the limitations set forth in the claims and any equivalents thereof.

Apparatus for Applying a Coating to a Substrate in Rolled Form

Referring now to FIG. 1, a cross-sectional side view of an exemplary apparatus (i.e. a reactor) for applying a coating to a substrate in rolled form is illustrated. The depicted apparatus 20 is suited to batch processes in connection with the disclosure, and has a body 22 including an inlet 24 and an outlet 26. The inlet 24 and the outlet 26 are on opposite sides of the substrate 30 in rolled form, and the substrate is positioned such that reactive gasses introduced at inlet 24 in direction D1 undergo a chemical reaction in passing through rolled substrate 30 to make their way to the outlet 26 in direction D2. In the depicted embodiment, a portion of the outer perimeter of rolled substrate 30 is conveniently held by double-sided flanges 32a, 32a', 32b, and 32b', although skilled artisans will recognize that other expedients can be used for holding the rolled substrate 30 in the body 22 of the apparatus 20.

Although a batch process is shown in FIG. 1 for illustrative purposes, it will be understood that a continuous process may be used. For example, rolls of substrate 30 may be conveyed (e.g. by a conveyor belt, not shown in the drawings) into a chamber (e.g. a reactor) used for applying a coating to the substrate in rolled form. Furthermore, although a single rolled substrate 30 is shown in FIG. 1 for illustrative purposes, it will be understood that more than one substrate in rolled form may be treated, for example, by stacking multiple substrate rolls on their lateral edge faces.

Methods for Applying a Coating to a Substrate in Rolled Form

Referring again to FIG. 1, the present disclosure features methods for treating a substrate 30 in rolled form, more particularly methods for applying a coating 25 to a substrate 30 in rolled form, the methods including providing a substrate 30 in rolled form, the substrate 30 comprising a first edge face 30a and a second edge face 30b opposite said first edge face, wherein the substrate 30 comprises a first major surface 28a and a second major surface (not shown in FIG. 1; see 28b in FIG. 2A) opposite said first major surface 28a, the first and second major surfaces 28a and 28b extending between the first edge face 30a and the second edge face 30b, and applying a coating 25 to at least one edge face 30a of the substrate 30 in rolled form. In some exemplary embodiments, the method includes applying a coating to at least one edge face 30a and at least a portion of at least one major surface (28a and/or 28b) of the substrate 30 in rolled form.

In any of the foregoing exemplary embodiments, the coating 25 may be applied to only a portion of at least one of the first major surface 28a and the second major surface 28b. This may be achieved, for example, by controlling the exposure time of the rolled substrate to the reactive gasses, or by controlling the concentration of the reactive gasses in an inert carrier gas, so that a self-limiting surface reaction takes place as the reactive gasses pass through first edge face 30a and across first major surface 28a and second major surface 28b of rolled substrate 30, as described further below. Such a self-limiting surface reaction may be used to coat or treat only that portion of the at least one of the first major surface 28a and the second major surface 28b extending from first edge face 30a, and leaving untreated or uncoated that portion of the at least one of the first major surface 28a and the second major surface 28b extending from the second edge face 30b.

Figure 2A:
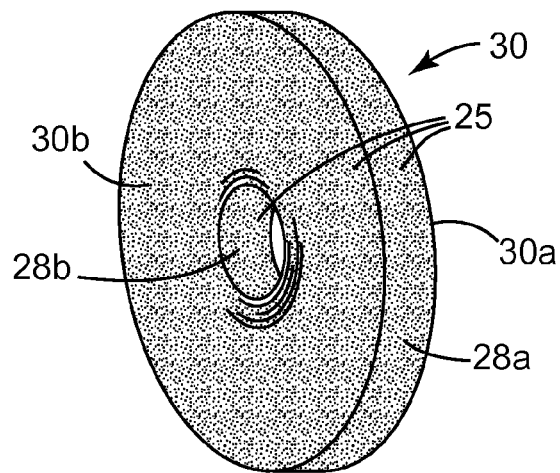
FIG. 2A is a perspective view illustrating an exemplary article in rolled form with a coating on at least one edge face and at least a portion of one major surface of the substrate according to some exemplary embodiments of the present disclosure.

Turning now to FIG. 2A, a perspective view is shown illustrating an exemplary article (e.g. an adhesive tape) comprising a substrate 30 in rolled form with a coating 25 applied to both edge faces (30a and 30b) and the entire first and second major surfaces (28a and 28b) of the substrate 30 in rolled form.

Figure 2B:
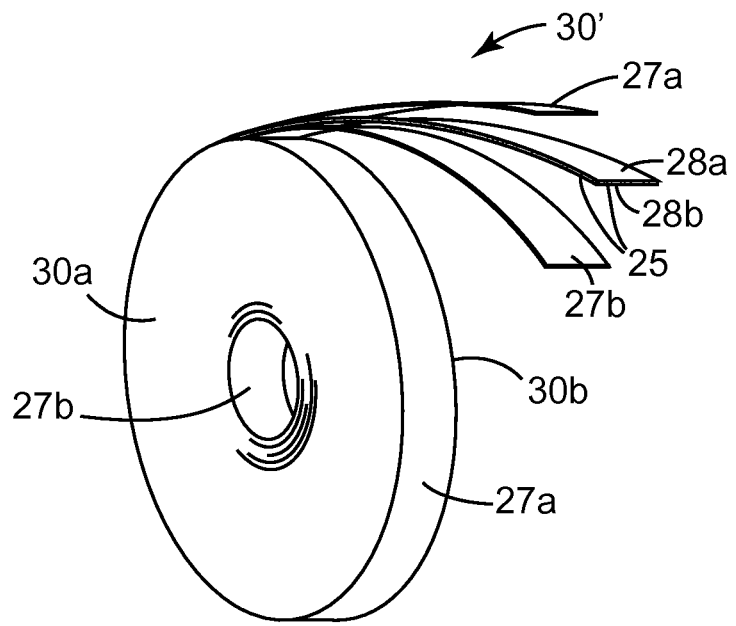
FIG. 2B is a perspective view illustrating an exemplary article in rolled form with a coating on at least one edge face of the substrate, the article including at least one liner, according to other exemplary embodiments of the present disclosure.

With reference now to FIG. 2B, a perspective view is shown of another exemplary article (e.g. an adhesive tape) comprising another substrate 30' in rolled form with a coating 25 on at least one edge face 30a of the rolled substrate 30', the article including at least one liner (27a and/or 27b), according to other exemplary embodiments of the present disclosure. As shown in FIG. 2B, two liners, one liner 27a positioned adjacent to and adhering tightly to first major surface 28a, and another liner 27b positioned adjacent to and adhering tightly to second major surface 28b, may be advantageously used to selectively apply a coating 25 to just the first edge face 30a, and optionally additionally to the second edge face 30b (not shown in the drawings), without applying the coating 25 to either the first or second major surfaces (25a and 25b).

In other exemplary embodiments not shown in the drawings, the coating 25 is applied to the entire first major 28a surface and both edge faces (30a and/or 30b). In other exemplary embodiments of any of the foregoing methods, the coating 25 is applied to the entire second major surface 28b and both edge faces (30a and/or 30b).

In certain alternative exemplary embodiments not shown in the drawings, the coating 25 may be applied to the entire first major 28a surface and both edge faces (30a and 30b) of the substrate 30' in rolled form. In other alternative exemplary embodiments not shown in the drawings, the coating is applied to the entire second major surface 28b and both edge faces (30a and 30b) of the substrate 30' in rolled form.

In any of the foregoing exemplary embodiments using at least one liner (27a and/or 27b), the coating 25 may be applied to only a portion of at least one or both of the first major surface 28a or the second major surface 28b, using a self-limiting surface reaction as exemplified above and described further below. Alternatively, a first liner 27a and/or a second liner 27b may be selected which extends across only a portion of the first major surface 28a and/or second major surface. Such embodiments, while not illustrated in the drawings, are within the level of ordinary skill in the art in view of the foregoing disclosure.

Figure 3:
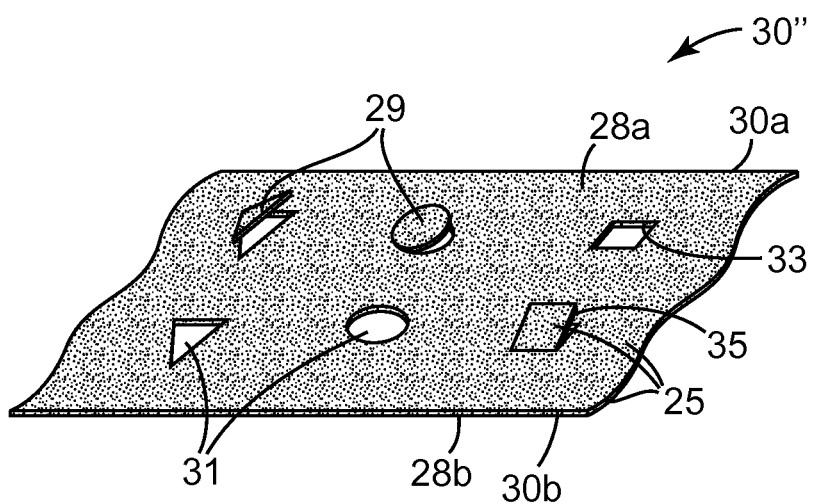
FIG. 3 is a top detailed perspective view illustrating an exemplary article in rolled form with a coating on at least one edge face and at least a portion of one major surface of the substrate, the substrate further including a plurality of perforations and optionally at least one chad attached to the inner perimeter wall of at least one of the perforations, according to other exemplary embodiments of the present disclosure.

Turning now to FIG. 3, a top detailed perspective view is shown illustrating an exemplary article (e.g. an adhesive tape) comprising yet another substrate 30" in rolled form with a coating 25 on at least one edge face (30a and/or 30b) and at least a portion of one major surface (28a and/or 28b) of the substrate 30, the substrate 30" further including a plurality of perforations 31 and optionally at least one chad 29 attached to the inner perimeter wall 35 of at least one of the perforations 31, extending between the first major surface 28a and the second major surface 28b.

In the particular exemplary article shown in FIG. 3, the coating 25 is applied to both edge faces (30a and 30b), the entire first and second major surfaces (28a and 28b), the chads (29) including the exposed edges of the chads, and the inner perimeter walls 35 of the perforations 31 of the substrate 30" in rolled form.

In some such exemplary embodiments, at least one of the plurality of perforations 31 includes a chad 29 attached to the inner perimeter wall 35 of the at least one of the plurality of perforations 31. In certain such exemplary embodiments, each of the plurality of perforations 31 includes a chad 29 attached to the corresponding inner perimeter wall 35 of the each of the plurality of perforations 31. In further exemplary embodiments of any of the foregoing such methods, each chad 29 comprises an exposed edge perimeter 33, and the coating 25 is applied to the exposed edge perimeter 33 of at least one chad 29. In additional such exemplary embodiments, the coating 25 is applied to the exposed edge perimeter 33 of each chad 29.

In further exemplary embodiments of the foregoing methods, the coating 25 is applied to at least a portion of the inner perimeter wall 35 of at least one of the plurality of perforations 31. In some such exemplary embodiments, the coating 25 is applied to the entire inner perimeter wall 35 of at least one of the plurality of perforations 31. In further such exemplary embodiments, the coating 25 is applied to the entire inner perimeter wall 35 of each of the plurality of perforations 31.

The plurality of perforations 31 and the corresponding plurality of chads 29 may have any shape, for example, triangular, circular, rectangular, square, polygonal, and the like, as illustrated by FIG. 3. The plurality of perforations 31 and the plurality of chads 29 may be created with any process, for example, by punching with a die (not shown) shaped to match the desired shape of the perforations 31 and the corresponding chads 29.

Various coating methods may be used for applying the coating 25 to the rolled substrate 30 (or 30' or 30"). In some exemplary embodiments, applying the coating 25 to the substrate 30 (or 30' or 30") is carried out using atomic layer deposition, molecular layer deposition, or a combination thereof. One particularly useful method is stepwise atomic layer deposition (ALD), as described, for example, in PCT International Publication Nos. WO 2011/037831 (Dodge) and WO 2011/037798 (Dodge).

ALD coating methods provide advantages compared with other techniques for applying a coating 25 to a rolled substrate 30 (or 30' or 30"). First, this method uses a series of sequential self-limiting surface chemical reactions to build up the coating, thereby allowing for precise control over the final thickness. Second, this method employs a reactive gas that is capable of permeating and coating porous materials and constructions. For example, two or more reactive gases can be iteratively transmitted through the rolled substrate to induce two or more self-limiting reactions on the surface of the rolled substrate. Nanoscale coatings having superior conformability and substantially uniform thickness are possible, since the deposition is non-directional and does not require a line of sight between the deposition apparatus and substrate. Finally, ALD can be used to deposit coatings of a variety of chemically diverse materials.

The application of the coating to the articles of the disclosure can be carried out at any useful temperature that does not damage the substrate. In some embodiments, the method is carried out, e.g., at a temperature of about 300° C. or less, about 200° C. or less, about 70° C. or less, or even about 60° C. or less.

In some useful embodiments of the present disclosure, the substrate is a porous polymeric substrate, more preferably a microporous polymeric substrate, even more preferably a microporous fibrous substrate web. In such embodiments, it is often convenient that the treatment be carried out at a temperature below the melting temperature of the porous polymeric substrate so as not to cause thermal distortion of the substrate or pores. For example, the method of the present disclosure can be operated at, e.g., below 300° C., below 250° C., below 200° C., below 150° C., below 100° C., below about 70° C. or less, or even below about 60° C. or less if that is desirable for the structural integrity of the substrate.

When making articles according to the present disclosure in reactors having an inlet and an outlet, it is possible, and sometimes convenient, to position at least a portion of at least a second substrate such that the substrate also separates the inlet from the outlet. It has been demonstrated that three or more substrates can be successfully treated simultaneously using the method.

The substrate can be treated in a batch process, or the substrate may be treated in a step-and-repeat sort of process, or it can be treated in a continuous motion process in which substrates in rolled form are conveyed (e.g., by a conveyor belt) into the treatment zone of a reactor configured for treating the rolled substrate. In some exemplary embodiments, the methods of the present disclosure may include treating at least one edge face of a substrate in rolled form while the roll is stationary. Alternatively, at least one edge face of the substrate may be treated while the rolls are being conveyed by a suitable conveying apparatus. In either scenario, the gap between the edge face(s) to be treated and the reactor inlet, as well as the exposure time of the edge face to the treatment, may be selected based upon a variety of factors related to, for example, the desired degree of treatment, the rolled substrate dimensions and/or the composition of the substrate.

One convenient variant of the method is to perform the process in a batch reactor such that the reactor itself is incorporated into the product intended for the end consumer. For example, the reactor may be in the form of a filter body, and both the filter body and the porous non-ceramic with its coatings applied in situ can be part of a filter to be sold to the end user. In some embodiments, multiple filters can be simultaneously treated in series or parallel connected flow paths.

In certain exemplary embodiments, applying the coating comprises a stepwise atomic layer deposition of the coating, wherein the stepwise atomic layer deposition of the coating comprises iteratively transmitting two or more reactive gases through the substrate in rolled form to induce two or more self-limiting reactions on at least one edge face and at least a portion of one major surface of the substrate in rolled form. Useful discussions of the application of self-limiting sequential coatings can be found, for example, in U.S. Pat. Nos. 6,713,177; 6,913,827; and 6,613,383.

Those familiar with the field of ALD reactions can readily determine which first and second reactive gases are appropriate choices for the self-limiting reactions according to the present method in order to create the coatings discussed above. For example, if an aluminum containing compound is desired, trimethylaluminum or triisobutylaluminum gases may be used as one of the two reactive gases. When the desired aluminum containing compound is aluminum oxide, the other reactive gas in the iterations can be water vapor or ozone. When the desired aluminum containing compound is aluminum nitride, the other reactive gas in the iterations can be ammonia or a nitrogen/hydrogen plasma. When the desired aluminum containing compound is aluminum sulfide, the other reactive gas in the iterations can be hydrogen sulfide.

Likewise, if instead of aluminum compounds, silicon compounds are wanted in the coating, one of the two reactive gases can be, e.g., tetramethylsilane or silicon tetrachloride.

The references incorporated above give further guidance about suitable reactive gases depending on the end result desired.

While a single iteration of the method can lay down a molecular monolayer that may be suitable for some purposes, many useful embodiments of the method will iterate the performing step for at least 8, 10, 20 or more iterations. Each iteration adds thickness to the coating. Therefore, in some embodiments, the number of iterations is selected to achieve a predetermined porosity or average internal pore diameter in the porous non-ceramic substrate. In some embodiments, by controlling the number of iterations performed, the coating can be used to controllably reduce the porosity of the porous non-ceramic substrate (e.g., to control the apparent pore size of the substrate) to achieve a desired porosity (e.g., a desired average internal pore diameter). For example, the coating may reduce the porosity of the porous non-ceramic substrate by 5% or more, 25% or more, or even 50% or more. Similarly, if the substrate comprises pores, the coating may reduce the average internal pore diameter by 5 nm or more.

In some applications, the purpose of applying the method is to achieve hydrophilicity on the interior surfaces of the substrate. In these applications, the step is iterated until a target surface energy such as, e.g., 72 dyne/cm (one commonly used definition of hydrophilic nature) is achieved. Further, it may also be desirable for the exterior surface of the porous non-ceramic substrate nearest the outlet to have a surface energy greater than 72 dyne/cm as well, and in these circumstances the performing step should be iterated until that target is achieved. In some specialized embodiments it may be desirable to have the interior surfaces hydrophilic while the exterior surface of the porous non-ceramic substrate nearest the outlet is left hydrophobic (e.g., less than 72 dyne/cm).

In many convenient embodiments, the substrate is suited to its end use once the coating has been applied on the desired substrate surfaces. However, it is sometimes useful to perform a secondary operation on the coating. This can be done either within the reactor or in another convenient apparatus. For example, even in cases where one or both of the edge surfaces or even the major surface surfaces of the substrate have been treated, e.g. to be rendered hydrophilic, one or both of the external major surfaces of substrate can be subsequently treated with a final size coating to render one or both of the major surfaces hydrophobic. This technique could be used to prepare, e.g., a vent filter for an endotracheal tube that should pass only gas and water vapor, not liquid water.

Another secondary operation that can be performed is to graft chemical moieties to the coating. For example, a discussion of a technique which can be extrapolated to provide a porous (co)polymeric substrate with a coating according to the present disclosure with grafted ligand groups, e.g., selected from polyethyleneimine ligand groups and biguanide ligand groups, can be found in U.S. Patent Application Publication Nos. 2010/0075131 and 2010/0075560. Grafting by radiant or particle energy can also be used to attach other useful ligands such as silanes, biologically active moieties such as antibodies, chelating agents, and catalytic coatings.

Materials

Various materials are useful in practicing the foregoing methods. Such materials may be broadly categorized as including substrates and coatings.

Substrates

In any of the foregoing methods, the substrate may comprise a rigid support, a flexible film, a fibrous web, or a combination thereof.

Suitable rigid supports include but are not limited to glass, wood, metals, treated metals (such as those comprising automobile and marine surfaces), (co)polymeric materials, and composite materials such as fiber reinforced (co)polymeric materials.

Useful flexible films include, but are not limited to, paper, poly-coated Kraft paper, supercalendered or glassine Kraft paper; (co)polymeric films such as poly(propylene), biaxially-oriented polypropylene, poly(ethylene), poly(vinyl chloride), polycarbonate, poly(tetrafluoroethylene), polyester [e.g., poly(ethylene terephthalate)], poly(ethylene naphthalate), polyamide such as DuPont's KAPTON™, cellulose acetate, and ethyl cellulose.

In addition, suitable substrates may be formed of (rigid or flexible) metal, metal foil, metallized (co)polymeric films, or ceramic sheet material. Substrates may also take the form of a cloth backing, e.g. a woven fabric formed of threads of synthetic fibers or blends of these.

In connection with the present disclosure, the physical topology of the substrate is not critical. Depending on end use, the substrate may be flat, pleated, tubular, porous, in the form of a thin hollow fiber, either singular or as a potted fiber cartridge, or any other useful configuration.

In some exemplary embodiments, the substrates may be surface treated (e.g., corona or flame treatment) or coated with, e.g., a primer or print receptive layer. In certain exemplary embodiments, multilayer substrates may be used.

In some exemplary embodiments, the substrate is porous, more preferably microporous. In certain exemplary embodiments, the substrate further comprises a (co)polymer. When a microporous (co)polymeric substrate is employed with the foregoing methods, it may be convenient to use substrates that have been rendered porous using an induced phase separation technique such as thermally induced phase separation (TIPS), vapor induced phase separation (VIPS), or the co-casting method of inducing phase separation discussed in U.S. Pat. No. 7,842,214.

Other ways of forming porous substrates from (co)polymeric materials for use with the present disclosure will commend themselves to the ordinary skilled artisan. For example, staple non-wovens such as stitchbonded or hydro-entangled webs may be used, as well as spunlaid non-wovens such as melt-blown or spun-bonded webs. For other applications, non-polymeric non-ceramic materials such natural fabrics, carbon fibers, fritted metal, or glass can be suitable.

In a presently preferred embodiment, the rolled substrate 30 is a microporous nonwoven fibrous web comprising a (co)polymeric material, made using a standard meltblown fiber forming process. Such a process is described in U.S. Patent Application Publication No. 2006/0096911 (Brey et al.) Blown microfibers are generally created by a molten (co)polymer that enters and flows through a die, the flow being distributed across the width of the die in the die cavity. The (co)polymer exits the die through a series of orifices as filaments. In one embodiment, a heated air stream passes through air manifolds and an air knife assembly adjacent to the series of (co)polymer orifices that form the die exit. This heated air stream is adjusted for both temperature and velocity to attenuate the (co)polymer filaments down to the desired fiber diameter. The fibers can then be conveyed in this turbulent air stream towards a rotating surface where they were collected to form a web.

Alternatively, the nonwoven material may be made using any of a number of other manufacturing methods known in the art. For example, the fibers may be electrospun or spun-bond. As a further alternative, the fibers could be drawn down to form staple fiber webs, crimped, and then cut into shorter lengths to be processed into a nonwoven web.

Nonwoven materials can be particularly suitable as rolled substrates for dental composites because they are highly open structures that allow a resin to permeate throughout the bulk of the nonwoven material. Nonwovens can also be manufactured with a wide range of effective fiber diameters (EFD), as determined by the method set forth in Davies, C. N., "The Separation of Airborne Dust and Particles," Institution of Mechanical Engineers, London Proceedings 1B, 1952. Advantageously, EFD can be used adjust the density, texture and handling properties of the composite. In some embodiments, the nonwoven has an average EFD of at least 0.1 micrometers, at least 0.5 micrometers, at least 1.0 micrometers, at least 2 micrometers, or at least 2.5 micrometers. In some embodiments, the nonwoven has an average EFD that is at most 20 micrometers, at most 15 micrometers, at most 10 micrometers, at most 8 micrometers, or at most 6 micrometers.

A nonwoven mat or fabric can be made from any of a variety of polymeric materials, including thermoplastic polyurethanes, polybutylenes, polyesters, polyolefins (e.g. polyethylene and polypropylene), polyesters, styrenic copolymers, nylon, and combinations thereof. In dental composite applications, polypropylene was found to be especially advantageous because it resisted absorption of most hardenable dental compositions and provided a relatively high degree of compressibility.

While a microporous nonwoven (co)polymeric material is presently preferred, the substrate can also be made from other microporous materials. For example, the substrate can be a foam (for example, cellulose foam, glass foam, polymeric foam, and combinations thereof), or a sponge. The microporous nonwoven material may alternatively comprise glass fibers (e.g., glass wool), ceramic fibers, cotton fibers, cellulose fibers, woven mats, scrims, and combinations thereof.

Other ways of forming porous substrates from polymeric materials will commend themselves to the ordinary artisan for use with the present disclosure. For example, staple nonwovens such as stitchbonded or hydro-entangled webs may be used, as well as spunlaid non-wovens such as melt-blown or spun-bonded webs. For other applications, non-polymeric non-ceramic materials such natural fabrics, carbon fibers, fritted metal, or glass can be suitable.

Coatings

In any of the foregoing methods, the coating preferably comprises an inorganic material formed by chemical reaction of the reactive gases. Optionally, the inorganic material comprises at least one oxide of aluminum, silicon, titanium, tin, zinc, or a combination thereof. In one presently preferred embodiment, ALD is used to deposit a conformal aluminum oxide ($Al_2O_3$) coating using the binary reaction $2\,Al(CH_3)_3 + 3H_2O \rightarrow Al_2O_3 + 6CH_4$. This can be split into the following two surface half-reactions:

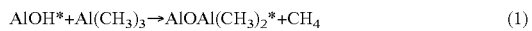
$$AlOH^* + Al(CH_3)_3 \rightarrow AlOAl(CH_3)_2^* + CH_4 \quad (1)$$

$$AlCH_3^* + H_2O \rightarrow AlOH^* + CH_4 \quad (2)$$

In reactions (1) and (2) above, the asterisks denote surface species. In reaction (1), $Al(CH_3)_3$ reacts with the hydroxyl ($OH^*$) species, depositing aluminum and methylating the surface. Reaction (1) stops after essentially all the hydroxyl species have reacted with $Al(CH_3)_3$. Then, in reaction (2), $H_2O$ reacts with the $AlCH_3^*$ species and deposits oxygen and rehydroxylates the surface. Reaction (2) stops after essentially all the methyl species have reacted with $H_2O$. Because each reaction is self-limiting, deposition occurs with atomic layer control.

In some embodiments, the coating has a thickness of at least 0.5 nanometers, at least 1 nanometer, at least 2 nanometers, at least 3 nanometers, or at least 4 nanometers. In some embodiments, the coating has a thickness of at most 100 nm, more preferably 50 nanometers, at most 20 nanometers, at most 15 nanometers, at most 10 nanometers, or at most 8 nanometers. Coating growth in ALD can be monitored and recorded using any known method, including use of a quartz crystal microbalance.

Materials capable of being coated using ALD include binary materials, i.e., materials of the form $Q_xR_y$, where Q and R represent different atoms and x and y are selected to provide an electrostatically neutral material. Suitable binary materials include inorganic oxides (such as silicon dioxide and metal oxides such as zirconia, alumina, silica, boron oxide, yttria, zinc oxide, magnesium oxide, titanium dioxide and the like), inorganic nitrides (such as silicon nitride, AlN and BN), inorganic sulfides (such as gallium sulfide, tungsten sulfide and molybdenum sulfide), as well as inorganic phosphides. In addition, various metal coatings are also possible, including cobalt, palladium, platinum, zinc, rhenium, molybdenum, antimony, selenium, thallium, chromium, platinum, ruthenium, iridium, germanium tungsten, and combinations and alloys thereof.

Self-limiting surface reactions can also be used to grow organic polymer films or coatings. This type of growth is often described as molecular layer deposition (MLD), since a molecular fragment is deposited during each reaction cycle. MLD methods have been developed for the growth of polymers such as polyamides, which uses dicarboxylic acid and diamines as reactants. Known approaches to MLD, involving heterobifunctional and ring-opening precursors, can also be used. Further details concerning MLD are described in George, et al., *Accounts of Chemical Research* (2009) 42, 498 (2009).

Other deposition methods can also be used to deposit a coating onto a rolled substrate. For example, layer-by-layer polyelectrolyte coating can be used to prepare a coating with precisely controlled thickness. This method involves depositing alternating cationic and anionic polyelectrolyte layers from aqueous solution to incrementally build up a surface coating. Additional details concerning layer-by-layer polyelectrolyte coating are provided in U.S. Patent Application Publication No. 2010/080841 (Porbeni, et al.).

Coatings that can be applied via atomic layer controlled growth techniques are preferred. Among coatings that are readily applied in such a manner are binary materials, i.e., materials of the form $Q_xR_y$, where Q and R represent different atoms and x and y are numbers that reflect an electrostatically neutral material. Among the suitable binary materials are various inorganic oxides (such as silicon dioxide and metal oxides such as zirconia, alumina, silica, boron oxide, yttria, zinc oxide, magnesium oxide, $TiO_2$ and the like), inorganic nitrides (such as silicon nitride, AlN and BN), inorganic sulfides (such as gallium sulfide, tungsten sulfide and molybdenum sulfide), as well as inorganic phosphides. In addition, various metal coatings are useful, including cobalt, palladium, platinum, zinc, rhenium, molybdenum, antimony, selenium, thallium, chromium, platinum, ruthenium, iridium, germanium and tungsten.

Useful discussions of the application of self-limiting sequential coatings can be found, for example, in U.S. Pat. Nos. 6,713,177; 6,913,827; and 6,613,383.

Those familiar with the field of ALD reactions can readily determine which first and second reactive gases are appropriate choices for the self-limiting reactions in order to create the coatings discussed above. For example, if an aluminum containing compound is desired, trimethylaluminum or triisobutylaluminum gases may be used as one of the two reactive gases. When the desired aluminum containing compound is aluminum oxide, the other reactive gas in the iterations can be water vapor or ozone. When the desired aluminum containing compound is aluminum nitride, the other reactive gas in the iterations can be ammonia or a nitrogen/hydrogen plasma. When the desired aluminum containing compound is aluminum sulfide, the other reactive gas in the iterations can be hydrogen sulfide.

Likewise, if instead of aluminum compounds, silicon compounds are wanted in the coating, one of the two reactive gases can be, e.g., tetramethylsilane or silicon tetrachloride. The references incorporated above give further guidance about suitable reactive gases depending on the end result desired.

While a single iteration with the discussed reactive gases can lay down a molecular layer that may be suitable for some purposes, many useful embodiments of the method will iterate the performing step for at least 8, 10, 20 or more iterations. Each iteration adds thickness to the coating. Therefore, in some embodiments, the number of iterations is selected to achieve a predetermined porosity or average internal pore diameter in the porous non-ceramic substrate. In some embodiments, by controlling the number of iterations performed, the coating can be used to controllably reduce the porosity of the porous non-ceramic substrate (e.g., to control the apparent pore size of the substrate) to achieve a desired porosity (e.g., a desired average internal pore diameter). For example, the coating may reduce the porosity of the porous non-ceramic substrate by 5% or more, 25% or more, or even 50% or more. Similarly, if the substrate comprises pores, the coating may reduce the average internal pore diameter by 5 nm or more.

In some applications, the purpose of applying the method is to achieve hydrophilicity on the major surfaces of the substrate, or the interior surfaces of a porous substrate. In these applications, the step is iterated until a target surface energy such as, e.g., 72 dyne/cm (one commonly used definition of hydrophilic nature) is achieved. Further, it may also be desirable for the major surface of the substrate positioned nearest the outlet to have a surface energy greater than 72 dyne/cm as well, and in these circumstances the performing step should be iterated until that target is achieved. In contrast, in some specialized embodiments, it may be desirable to have the interior pore surfaces hydrophilic while the exterior major surface of the substrate nearest the outlet is left hydrophobic (e.g., less than 72 dyne/cm).

Articles in Rolled Form

In another aspect, an article in rolled form is prepared according to any of the foregoing methods. In various presently preferred embodiments, the rolled substrate of the present disclosure may be a roll of an adhesive tape that includes a backing layer and an adhesive coating disposed on a major surface of the backing layer. The adhesive tape rolls may further include a release coating, or low adhesion backsize, disposed on a second major surface.

Alternatively, the adhesive tape rolls may include at least one liner (27a and/or 27b in FIG. 2B) which may have a release coating disposed on a major surface of a substrate) in contact with the adhesive coated major surface of the backing layer. As another example, an adhesive tape roll may include a release liner comprising a release coating disposed on at least a portion of each of its major surfaces and an adhesive coating deposited over one of the release coatings.

Examples of suitable backing layers include, without limitation, cellophane, acetate, fiber, polyester, vinyl, polyethylene, polypropylene including, e.g., monoaxially oriented polypropylene and biaxially oriented polypropylene, polytetrafluoroethylene, polyvinylfluoroethylene, polyurethane, polyimide, paper (e.g., polycoated Kraft paper, and supercalendered or glassine Kraft paper), woven webs (e.g., cotton, polyester, nylon and glass), nonwoven webs, foil (e.g., aluminum, lead, copper, stainless steel and brass foil tapes) and combinations thereof.

Examples of suitable release liner substrates include papers and polymeric films. Examples of suitable release coating compositions include, without limitation, silicone, fluorocarbons, and polyolefins including, e.g., polyethylene and polypropylene. The backing layers and, when present, release liners, can also include reinforcing agents including, without limitation, fibers, filaments (e.g., glass fiber filaments), and saturants (e.g., synthetic rubber latex saturated paper backings). Common types of adhesive tapes that can be treated using the methods of the present disclosure include masking tape, electrical tape, duct tape, filament tape, medical tape, transfer tape, and the like.

Unexpected Results and Advantages

Exemplary embodiments of the present disclosure have advantages over other substrate coating methods. In contrast to most previous coating methods, in some exemplary embodiments, methods of the present disclosure provide the ability to selectively apply a coating 25 to at least one (or both) edge faces (30a and 30b), at least a portion of (or the entirety of) at least one of the first and second major surfaces (28a and 28b), any chads (29) including the exposed of the chads (29), and the inner perimeter walls 35 of any perforations 31 of the substrate 30 (or 30' or 30") in rolled form.

In addition, there are other significant advantages in using the presently disclosed methods for applying a coating to a substrate in rolled form compared to the previously disclosed sheet coating processes or the previously disclosed roll to roll web coating processes. These advantages include, in some embodiments, selectively surface treating only a portion of at least one of the first and second major surfaces (28a and 28b), surface treating the newly formed die-cut edges of chads and/or perforations in the web, and avoiding the possibility of dislodging partially die-cut chads (no unwind/rewind steps) prior to a manufacturing assembly process.

These advantages further include, in some exemplary embodiments, the ability to surface treat the newly die-cut chads and/or perforations in a nonwoven fibrous web after it has been converted, in addition to all of the original interior and exterior surfaces of the nonwoven web, to provide the improved surface characteristics for the entire rolled substrate article or web. Another advantage is the ability of the presently disclosed methods to coat all of these surfaces without the need to re-expose the substrate surface by unwinding and rewinding the substrate as a web, thereby reducing the possibility of inadvertently dislodging of the die-cut articles prior to manufacturing assembly process. By selectively imparting the attribute improving surface treatment onto the substrate while it remains in a roll form, the ability of the chad and any attached component to become dislodged is eliminated since there is no unwinding or rewinding of the substrate carried out in the currently disclosed methods.

Furthermore, as described above, in exemplary methods of the present disclosure, the coating can be either polymeric (organic) or ceramic (inorganic). With particular reference to substrates used as temporary supports for repositionable dental composites, for example, applying an inorganic coating to a microporous non woven fibrous web substrate may provide one or more surprising technical advantages. First, the presence of the inorganic material at the surface of the polymeric fibers substantially changes the surface chemistry of the fibers. The inorganic coating can be present in an amount sufficient to enhance the wetting behavior of the rolled substrate. For thin layer depositions, the extent of the modification can also be tailored by controlling layer thickness.

Moreover, atomic layer deposition is a quantitative deposition method, thus providing precise control over layer thickness that is superior to conventional methods such as physical vapor deposition or sputtering. Having a tailored wetting behavior can help ensure that the fibers are substantially uniformly coated by the hardenable component (or resin). Enhanced wettability can also facilitate uptake and/or saturation of the resin in the nonwoven material. All of these factors can positively affect bond strength and bonding predictability of the adhesive assembly.

Second, the inorganic coating can provide a chemistry for further surface modification, such as silane treatment (or silanation). Advantageously, a silanated surface can allow for chemical bonding between the substrate and a subsequently applied adhesive. Unlike previously known adhesive assemblies, these assemblies allow for both mechanical and chemical bonding between the rolled substrate and the adhesive. This can significantly enhance bond strength and bond reliability. A unique feature of the provided dental composites is that covalent bonding occurs not only at the interface between the resin and the inorganic coating but also the interface between the inorganic coating and the fibers of nonwoven material. Further options and advantages of silane treatment are described in U.S. Patent Application Publication No. 2012/0070794 (Tzou, et al.).

Third, the inorganic coating serves as a chemical barrier between the resin and the fibers of the nonwoven material. This is especially significant here, where the nonwoven mat is polymeric and has the potential to contain oligomers, additives, stabilizers, or other small molecules capable of leaching out of the polymer. By substantially uniformly coating the fibers, the inorganic coating can minimize or prevent these extractable components from leaving the fibers in the presence of the resin or a solvent. Further, the coating can also serve as a barrier to certain gases, such as oxygen, which could diffuse out of nonwoven fibers and inhibit resin polymerization. Solvent extraction studies, which showed that adhesive assemblies with coated polypropylene fibers displayed reduced loss of mass compared with adhesives assemblies with uncoated polypropylene fibers (see Examples).

Fourth, coating one or more major surfaces of the rolled substrate with a thin conformal layer can also reduce the level of rebound in the overall composite. This can be especially beneficial with respect to orthodontic adhesive applications, where the rebound should generally be minimized. Low rebound is desirable not only to express as accurately as possible the in-out prescription of the appliance but also to alleviate the risk of voids or cavitation in the composite result from air entering in the composite upon rebound. Surprisingly, nonwoven materials coated with a conformal alumina coating ranging in thickness from 4 to 8 nanometers are observed to display not only excellent wettability and barrier properties, but also decreased rebound compared with equivalent uncoated materials.

Finally, application of an inorganic coating on at least one major surface of a nonwoven substrate material provides a convenient mechanism to modify the bulk mechanical properties of the adhesive assembly. For example, the ALD coating can be used to stiffen fibers of a nonwoven substrate, thereby stiffening the substrate. Alternatively, these coatings can be used to precisely alter the permeability of the substrate, or the level of rebound which occurs when a compliant substrate material is compressed and then allowed to relax. Each of these represents a significant bulk property that can be adjusted to provide optimal adhesive handling.

Exemplary embodiments of the present disclosure have been described above and are further illustrated below by way of the following example, which is not to be construed in any way as imposing limitations upon the scope of the present disclosure. On the contrary, it is to be clearly understood that resort may be had to various other embodiments, modifications, and equivalents thereof which, after reading the description herein, may suggest themselves to those skilled in the art without departing from the spirit of the present disclosure and/or the scope of the appended claims.

EXAMPLE

The following example is intended to illustrate exemplary embodiments within the scope of this disclosure. Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. At the very least, and not as an attempt to limit the application of the doctrine of equivalents to the scope of the claims, each numerical parameter should at least be construed in light of the number of reported significant digits and by applying ordinary rounding techniques.

Exemplary ALD Coating Apparatus and Procedure

A reactor generally as depicted in FIG. 1 was constructed using three 6 inch (15.24 cm) diameter double side flanges commercially available as ConFlat Double Side Flanges (600-400-D CF) from Kimball Physics Inc. of Wilton, N.H. To this stack of flanges on what was to be the upstream side was attached one 6 inch (15.24 cm) diameter ConFlat Double Side Flange (600DXSP12) from Kimball Physics Inc., which has one ⅛" (0.32 cm) NPT side hole. This side hole was used to attach a Baratron (10 torr) pressure gauge, commercially available from MKS Instruments of Andover, Mass., so that the head pressure (before the material) during the process could be monitored. This stack of elements was capped on each end with a 6 inch diameter (15.24 cm) ConFlat Zero-Length Reducer Flange (600×275-150-0-T1) commercially available from Kimball Physics Inc. At each of the junctions in the stack, appropriate sized copper gaskets were used so as to make a good vacuum seal.

To this stack of elements, first a 2.75 inch (7 cm) diameter ConFlat Double Side Flanges (275-150-D CF) was attached to the inlet side, followed by a 2.75 inch (7 cm) diameter ConFlat Double Side Flanges with one ⅛" (0.32 cm) NPT Side Hole (275DXSP12), and further followed by a 2.75 inch (7 cm) diameter ConFlat Solid/Blank flange. The ⅛" (0.32 cm) NPT Side Hole was used for introducing the reactive gases as will be discussed below.

To the outlet side of this stack of elements, a 25 ISO to 275 CF Reducer (QF25×275) was attached, followed by a 2.75 inch (7 cm) diameter ConFlat Double Side Flanges with a ⅛" (0.32 cm) NPT Side Hole (275DXSP12) which was then followed by a ConFlat Double Side Gate Valve which was again followed by another 2.75 inch (7 cm) diameter ConFlat Double Side Flanges with a ⅛" (0.32 cm) NPT Side Hole (275DXSP12). This was followed by a 25 ISO to 275 CF Reducer (QF25×275) which was then connected to a XDS-5 Scroll pump (equipped with purging capability) via flexible Stainless Steel vacuum hose.

Attached to the first 1/8" (0.32 cm) NPT Side Hole of the first ConFlat Double Side Flange (275DXSP12) (prior to the gate valve) was a MKS Baratron (10 torr) gauge for exhaust reactor pressure readout, a SRS PPR300Residual Gas Analyzer with bypass sampling and a roughing/bypass line connected in-line with a needle valve. This bypass line setup allowed for the gases to flow around the gate valve for reduced pumping but was also found to be useful as a secondary pumping line to allow for greater reactor pressure during surface treatments. The 1/8" (0.32 cm) NPT Side Hole of the second ConFlat Double Side Flange (275DXSP12) (following the gate valve) was used as a re-entry port for the valved roughing/bypass line containing the needle valve discussed above.

Inlet for the reactive gases were disposed with the 1/8" NPT side hole in the 2.75 inch (7 cm) diameter ConFlat Double Side Flanges on the inlet side as discussed above. This inlet line was fed from a gas manafold in which the purge gas (process nitrogen ($N_2$)) as well as both the first and the second reactive gases flowed. Further, the manifold was designed so that the purge gas line entered into the manifold first followed by the inlet lines for the first and second reactive gases. This allowed for the process nitrogen ($N_2$) in the manifold to maintain a continuous positive flow of gas out of the manifold to assure that there was no back streaming of any of the reactive gases into the supply line of the other reactive gases.

As further protection against the inadvertent cross-contamination of the inlet lines for the first and the second reactive gases, the line for the first reactive gas was directed through a normally closed valve, and the line for the second reactive gas was directed through a normally open valve. These control ports two valves were set up to be activated in tandem by the same switch to assure that the two lines could not both be adding precursor gases to the reactor at the same time.

Each of the lines was secondarily controlled on and off by a separate valving system equipped with an in-line needle valve of the SS Metering Bellows-Sealed Valve type to precisely control the rate of flow of each of the precursor gases. Upstream of each of these metering valves was a flow control valve commercially available as 316L VIM/VAR UHP Diaphragm-Sealed Valve, commercially available from Swagelok Company of Solon, Ohio. Upstream of each of these flow control valves was a reactive gas supply tank in the form of a 300 mL capacity stainless steel bubbler, commercially available as catalog no. Z527068 from Sigma-Aldrich, of St. Louis, Mo.

This reactor/apparatus as described above was equipped with diverse band heaters, heating tapes and cartridge heaters of conventional types to control the temperatures of the reactor and its gas supplies.

While the specification has described in detail certain exemplary embodiments, it will be appreciated that those skilled in the art, upon attaining an understanding of the foregoing, may readily conceive of alterations to, variations of, and equivalents to these embodiments. Accordingly, it should be understood that this disclosure is not to be unduly limited to the illustrative embodiments set forth hereinabove. Furthermore, all publications, published patent applications and issued patents referenced herein are incorporated by reference in their entirety to the same extent as if each individual publication or patent was specifically and individually indicated to be incorporated by reference. Various exemplary embodiments have been described. These and other embodiments are within the scope of the following listing of disclosed embodiments.

The invention claimed is:

1. A method comprising:
providing a substrate in rolled form, the substrate comprising:
a first edge face; and
a second edge face opposite said first edge face,
wherein the substrate comprises a first major surface and a second major
surface opposite said first major surface, the first and second major surfaces extending between the first edge face and the second edge face, and
applying a coating to at least one edge face and optionally at least a portion of one major surface of the substrate in rolled form, wherein applying the coating is carried out using atomic layer deposition, molecular layer deposition, or a combination thereof while the substrate is in rolled form.

2. The method of claim 1, wherein applying the coating comprises a stepwise atomic layer deposition of the coating, wherein the stepwise atomic layer deposition of the coating comprises iteratively transmitting two or more reactive gases through the substrate in rolled form to induce two or more self-limiting reactions on at least one edge face of the substrate in rolled form.

3. The method of claim 1, wherein the coating is applied to at least a portion of one of the first major surface or the second major surface.

4. The method of claim 1, wherein the coating is applied to at least a portion of each of the first and second major surface.

5. The method of claim 1, wherein the coating is applied to the entire first major surface and both edge faces.

6. The method of claim 1, wherein the coating is applied to the entire second major surface and both edge faces.

7. The method of claim 1, wherein the substrate further comprises a plurality of perforations, each of the plurality of perforations having an inner perimeter wall extending between the first major surface and the second major surface.

8. The method of claim 7, wherein at least one of the plurality of perforations includes a chad attached to the inner perimeter wall of the at least one of the plurality of perforations.

9. The method of claim 8, wherein each of the plurality of perforations includes a chad attached to the corresponding inner perimeter wall of the each of the plurality of perforations.

10. The method of claim 9, wherein each chad comprises an exposed edge perimeter, and further wherein the coating is applied to the exposed edge perimeter of at least one chad.

11. The method of claim 10, where the coating is applied to the exposed edge perimeter of each chad.

12. The method of claim 7, wherein the coating is applied to at least a portion of the inner perimeter wall of at least one of the plurality of perforations.

13. The method of claim 12, wherein the coating is applied to the entire inner perimeter wall of at least one of the plurality of perforations.

14. The method of claim 13, wherein the coating is applied to the entire inner perimeter wall of each of the plurality of perforations.

15. The method of claim 1, wherein the substrate comprises a flexible film, a fibrous web, or a combination thereof.

16. The method of claim 1, wherein the substrate is microporous.

17. The method of claim 1, wherein the substrate further comprises a (co)polymer.

18. The method of claim 1, wherein the coating comprises an inorganic material, optionally wherein the inorganic material comprises at least one oxide of aluminum, silicon, titanium, tin, zinc, or a combination thereof.

19. An article in rolled form prepared according to the method of claim 1.

* * * * *

UNITED STATES PATENT AND TRADEMARK OFFICE
CERTIFICATE OF CORRECTION

PATENT NO.        : 9,243,322 B2
APPLICATION NO.   : 14/353965
DATED             : January 26, 2016
INVENTOR(S)       : Bill Dodge It is certified that error appears in the above-identified patent and that said Letters Patent is hereby corrected as shown below:

In The Specification

Column 4
Line 46, After "materials" insert -- . --.

Column 5
Line 58, Delete "to" and insert -- 25 to --, therefor.
Line 65, Delete "to" and insert -- 30 to --, therefor.

Column 17
Line 19, Delete "manafold" and insert -- manifold --, therefor.

Signed and Sealed this
Twenty-third Day of August, 2016

Michelle K. Lee
*Director of the United States Patent and Trademark Office*